United States Patent [19]
Zandy et al.

[11] Patent Number: 6,126,451
[45] Date of Patent: *Oct. 3, 2000

[54] SCSI CONNECTOR

[75] Inventors: Michael S. Zandy, Spring; George J. Scholhamer, The Woodlands; William C. Galloway, Houston, all of Tex.

[73] Assignee: Compaq Computer Corporation, Houston, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/867,102

[22] Filed: Jun. 2, 1997

[51] Int. Cl.[7] .................................................. H01R 12/04
[52] U.S. Cl. ............................ 439/61; 361/788; 361/777; 395/250
[58] Field of Search ............................... 439/61, 65, 631; 361/788, 777; 395/250

[56] References Cited

U.S. PATENT DOCUMENTS

| | | | |
|---|---|---|---|
| 5,175,822 | 12/1992 | Dixon et al. | 395/275 |
| 5,237,660 | 8/1993 | Weber et al. | 395/250 |
| 5,289,340 | 2/1994 | Yoshifuji | 439/61 |
| 5,471,639 | 11/1995 | Harrington | 395/842 |
| 5,544,326 | 8/1996 | Pease et al. | 395/250 |
| 5,546,550 | 8/1996 | Carter | 395/309 |
| 5,903,442 | 5/1999 | Kanai et al. | 439/61 |
| 5,930,119 | 7/1999 | Berding | 439/61 |

*Primary Examiner*—Gary F. Paumen

[57] ABSTRACT

In a computer system having redundant SCSI controllers cards, a SCSI controller interface for receiving multiple interchangeable SCSI controller cards is configured so that the data bus paths between each of the SCSI controller slots and the controller circuitry do not cross.

7 Claims, 4 Drawing Sheets

SCSI CONNECTOR

FIELD OF THE INVENTION

The present invention relates to computer connecters, and more particularly, but not by way of limitation, to a small computer systems interface (SCSI) connector interface for receiving multiple, redundant and interchangeable SCSI controllers.

BACKGROUND OF THE INVENTION

Today's businesses are becoming more and more dependent upon computer systems, including network computer systems, for their day-to-day operations. As can be appreciated, the requirement for minimum down-time of these computer systems is imperative, especially in network computer systems, where many users can be affected when a single component in the systems fails.

Some of the current computer technologies have started utilizing "hot pluggable", redundant power supplies, whereby if one supply fails or needs replacing, the power to the computer system is maintained by the second power supply, such that the computer system does not need to be powered down while the defective power supply is being repaired or replaced. However, as can be appreciated, there are many other components such as controller interface, within a computer system that can fail, causing system downtime.

Many current computer systems use a small computer systems interface (SCSI) for connecting peripheral components, such as scanners, hard disk drives and compact disk drives, to the computer system via a standard hardware interface, which uses standard SCSI commands. If the SCSI controller fails, access by the users to the device drives controlled by the SCSI is prevented.

Therefore, it is highly desirable to have a hot pluggable, SCSI backplane interface that can receive redundant, interchangeable SCSI controller cards.

SUMMARY OF THE INVENTION

The present invention overcomes the above identified problems as well as other shortcomings and deficiencies of existing technologies by providing a computer system utilizing a SCSI controller backplane configured for receiving multiple interchangeable SCSI controller cards. The SCSI controller backplane is further configured so that the data paths between the SCSI controller slots and the SCSI controller circuitry do not cross.

BRIEF DESCRIPTION OF THE DRAWINGS

A more complete understanding of the present invention may be had by reference to the following Detailed Description and appended claims when taken in conjunction with the accompanying Drawings wherein:

DETAILED DESCRIPTION

Figure 1:
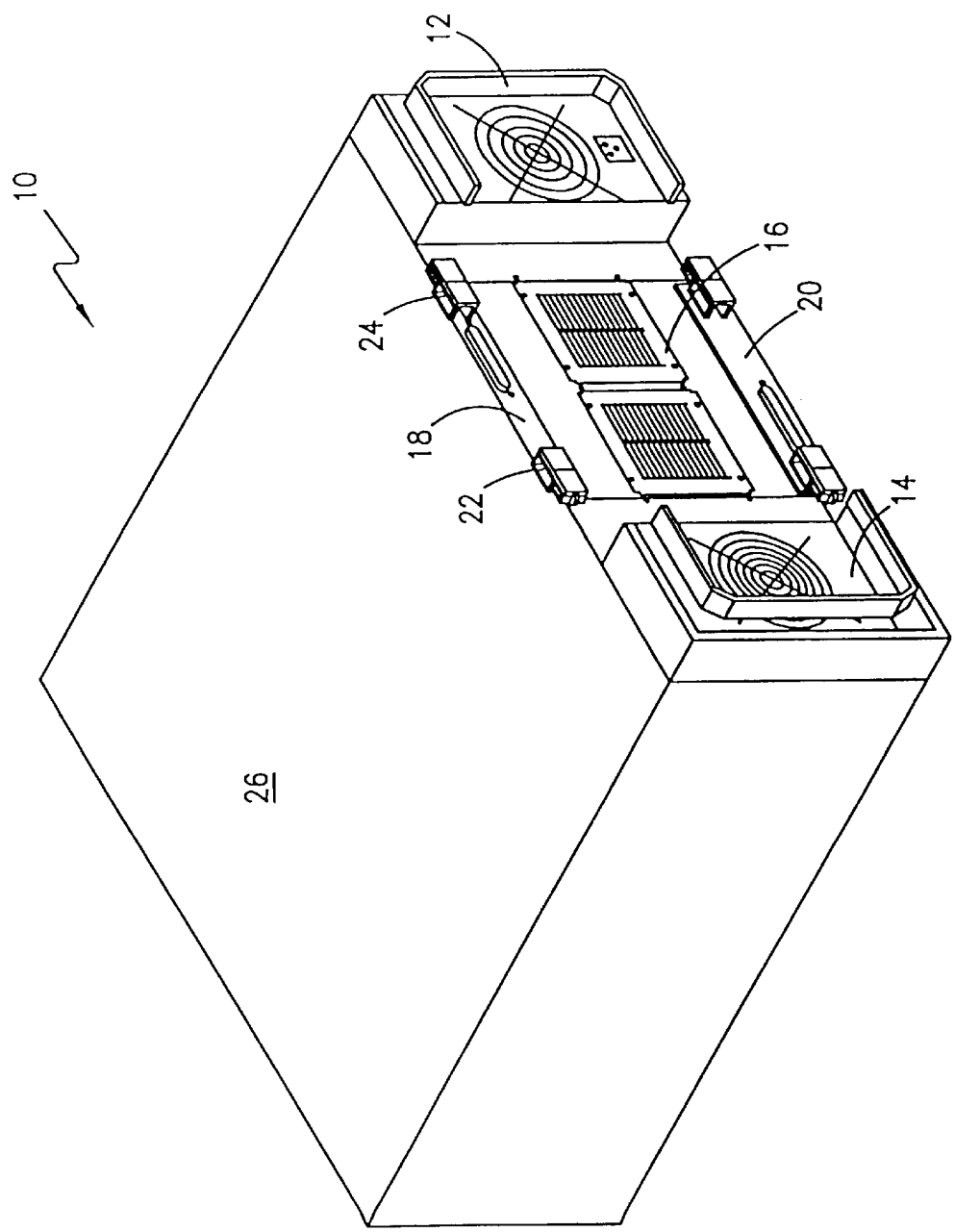
FIG. 1 is a rear perspective view of a computer system utilizing the present invention.

Referring now to the drawings wherein like or similar elements are designated with identical reference numerals throughout the several views, and wherein the various elements depicted are not necessarily drawn to scales, and, in particular, to FIG. 1, there is shown a rear perspective view of a computer system 10 utilizing the present invention. As depicted, computer system 10 includes redundant power supplies 12 and 14, cooling system 16 and redundant small computer systems interface (SCSI) controller cards 18 and 20, also referred to as control cards or controller interfaces. Each of SCSI controller cards 18 and 20 include installation clips 22 and 24 for securing the SCSI controller cards 18 and 20 within the computer system 10. As can be appreciated, the redundancy of SCSI controller cards 18 and 20 provides for a back-up system wherein if one SCSI controller card fails the other can take over until proper maintenance can take place, and, further, the redundancy enables the SCSI controller cards to be hot pluggable, i.e. the redundancy enables the SCSI controller cards to be removed and installed without powering down the computer system. This helps to reduce down-time of computer system 10 for repair or replacement of SCSI controllers cards 18 and 20.

Still referring to FIG. 1, it is also preferred that SCSI controller cards 18 and 20 be interchangeable with each other, with each being inserted into computer system 10 in a "flipped" horizontal relationship, i.e. a 180° opposite orientation.

Figure 2:
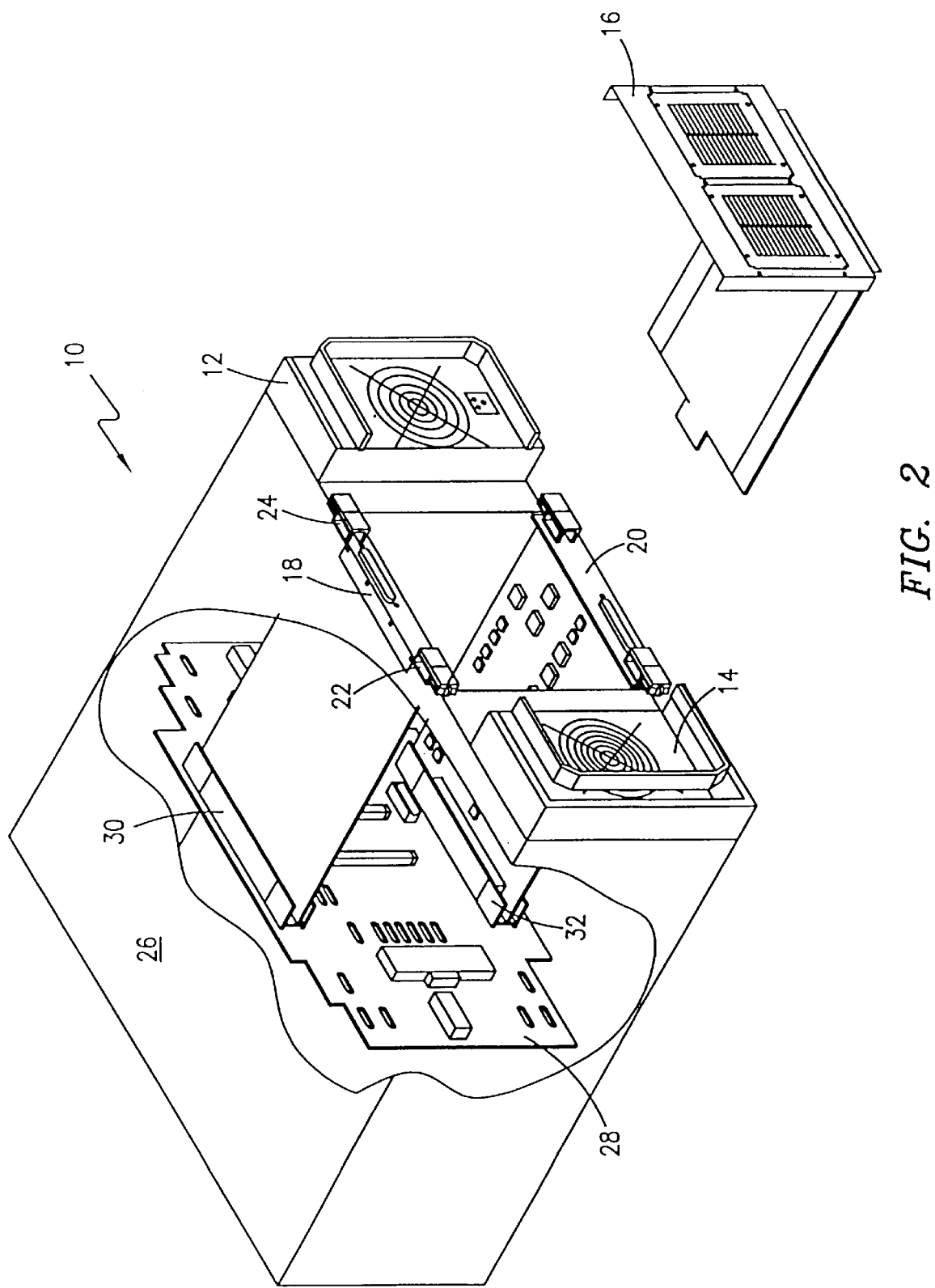
FIG. 2 is partially rear perspective view of the computer system as similarly shown in FIG. 1 with portions broken away illustrating a backplane utilizing the present invention.

Referring now to FIG. 2, there is illustrated a perspective view of computer system 10 with the cooling system 16 removed therefrom and with a portion of the housing 26 broken away. As depicted, redundant SCSI controllers 18 and 20 interface with the computer system 10 by being inserted into a back-plane or SCSI controller interface 28. FIG. 2 further illustrates the 180° opposite orientation relationship between SCSI controller cards 18 and 20.

Figure 3:
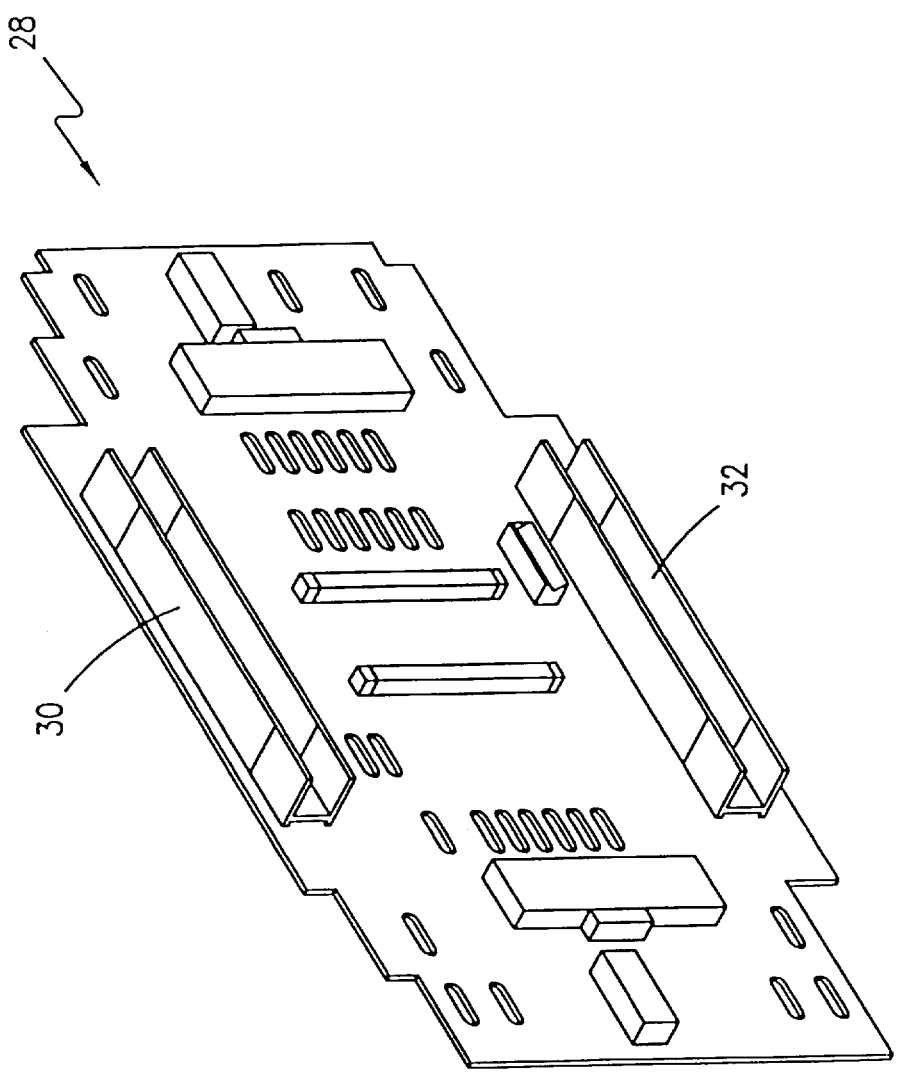
FIG. 3 is an enlarged perspective view of the backplane as similarly shown in FIG. 2.

Referring now to FIG. 3, there is illustrated a perspective view of SCSI controller interface 28. As depicted, SCSI controller interface 28 includes two SCSI slot connectors 30 and 32 for receipt of SCSI controller cards 18 and 20 therein.

Figure 4:
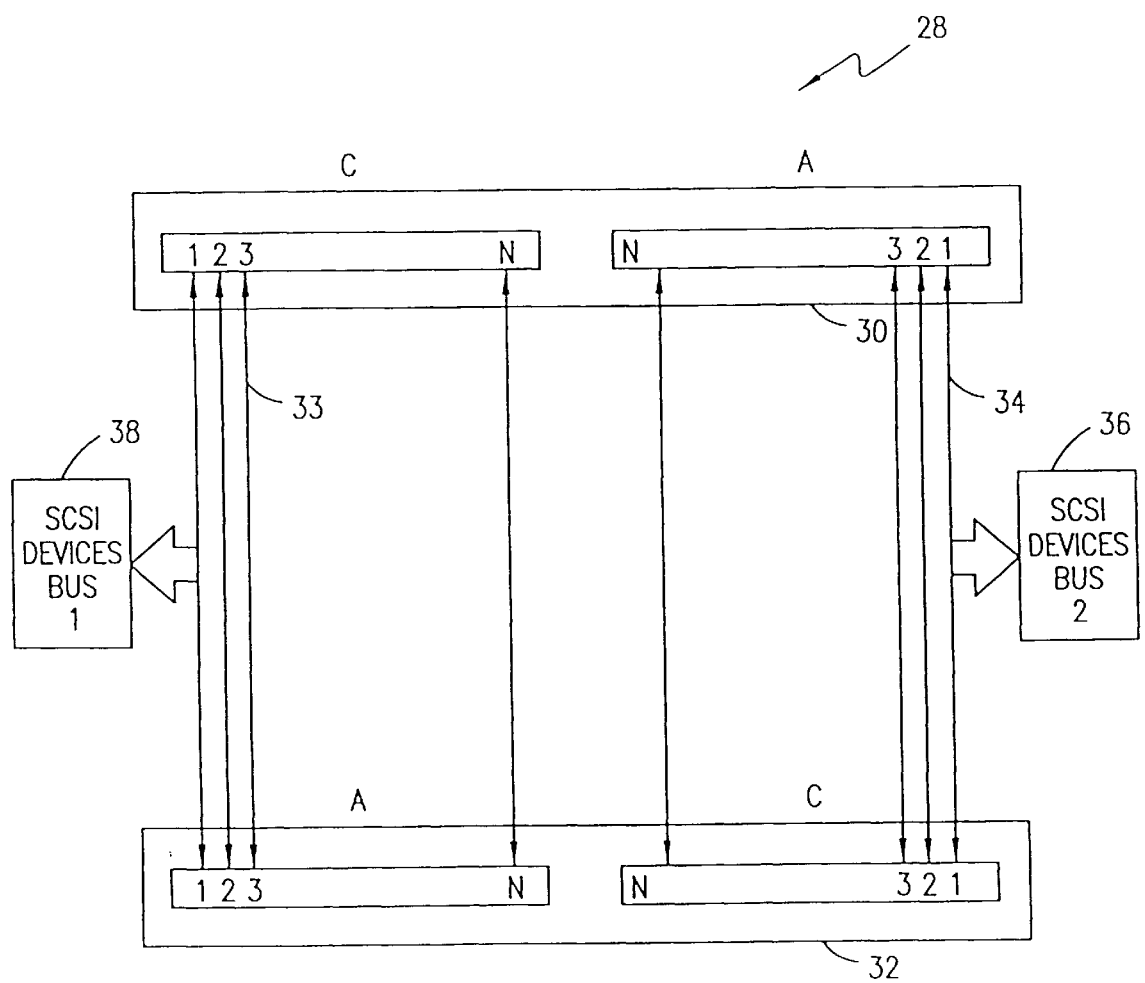
FIG. 4 is a schematic block diagram illustrating an exemplary embodiment of the present invention.

Referring now to FIG. 4, there is illustrated a schematic block diagram of SCSI controller interface 28 in accordance with the principles of the present invention. As depicted, SCSI controller interface 28 includes SCSI slot connectors 30 and 32, each including two slot portions 'A' and 'C'. Each slot portion includes multiple connectors 1–N, i.e., data connectors 1–N or contacts 1–N. The connectors of slot portion 'C' of SCSI slot connector 30 and the connectors of slot portion 'A' of SCSI slot connector 32 are connected to SCSI devices bus 38 through data paths 33. The connectors of slot portion 'A' of SCSI slot connector 30 and the connectors of slot portion 'C' of SCSI slot connector 32 are connected to SCSI devices bus 36 through data paths 34. As depicted, the arrangement of the connectors in slot portion 'A' is mirrored, i.e., cross-symmetrically configured, with respect to the arrangement of the connectors in slot portion 'C'. Further, the arrangement of slot portions 'A' and 'C' in SCSI slot connector 30 are reversed from the arrangement of slot portions 'A' and 'C' in SCSI slot connector 32. The cross-symmetrical (non-crossing) arrangement of the connectors within the slots as well as the orientation of the slot portions permits the interchangability of SCSI controller cards 18 and 20 between SCSI slot connectors 30 and 32 without having to cross the data bus paths 33 and 34 from the SCSI slot connectors 30 and 32 to SCSI devices busses 36 and 38 (as depicted in FIG. 4). By not having to cross the data bus paths, the design of the SCSI controller card is kept simple, facilitating easy repair and lowering production costs by not having to provide for the isolation of the crossing data paths.

Although SCSI slot connectors 30 and 32 are depicted with two slot portions 'A' and 'C' having mirrored arranged connectors (1–N), it is contemplated that other arrangements of the connectors and multiple slot portions could be utilized so that the data bus paths 34 from the SCSI slot connectors to the SCSI controller circuitry do not cross.

Those skilled in the art can realize that the teachings of the present invention as described hereinabove provide a SCSI controller interface for receiving multiple interchangeable SCSI controller cards. The SCSI controller interfaces are configured so that the data paths between the SCSI controller slots and the controller circuitry do not cross.

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A computer system for interfacing multiple interchangeable peripheral components, said computer system comprising:

a backplane;

a first connector connected to said backplane, said first connector for receiving a first interchangeable peripheral component, said first connector including a plurality of contacts for transferring data between said first connector and the first interchangeable peripheral component, said plurality of contacts of said first connector arranged in a first configuration;

a second connector connected to said backplane, said second connector for receiving a second interchangeable peripheral component, said second connector including a plurality of contacts for transferring data between said second connector and the second interchangeable peripheral component, said plurality of contacts of said second connector arranged in a second configuration, said second configuration being a cross-symmetrical configuration of said first configuration; and data bus paths connected to the first connector and the second connector, said data bus paths not crossing one another;

wherein the first connector and the second connector are configured such that the first interchangeable peripheral component and the second interchangeable peripheral component are interchangeable between the first connector and the second connector.

2. The computer system of claim 1, further comprising the first interchangeable peripheral component.

3. The computer system of claim 2, wherein the first interchangeable periperal component is a SCSI card.

4. The computer system of claim 1, wherein the first connector is a SCSI connector.

5. The computer system of claim 1, wherein the first connector is for receiving the first interchangeable peripheral component while the computer system is powered.

6. The computer system of claim 1, further comprising:

a device bus connected to the data bus paths.

7. The computer system of claim 6, wherein the device bus is a SCSI device bus.

* * * * *